(12) United States Patent
Wong et al.

(10) Patent No.: US 11,953,312 B2
(45) Date of Patent: Apr. 9, 2024

(54) SYSTEM AND METHOD OF OBJECT INSPECTION USING MULTISPECTRAL 3D LASER SCANNING

(71) Applicant: MIT SEMICONDUCTOR PTE LTD, Singapore (SG)

(72) Inventors: Kok Weng Wong, Singapore (SG); Albert Archmawety, Singapore (SG); Jun Kang Ng, Singapore (SG); Chee Chye Lee, Singapore (SG)

(73) Assignee: MIT SEMICONDUCTOR (TIAN JIN) CO., LTD, Tianjin (CN)

( * ) Notice: Subject to any disclaimer, the term of this patent is extended or adjusted under 35 U.S.C. 154(b) by 259 days.

(21) Appl. No.: 17/426,674

(22) PCT Filed: Feb. 1, 2019

(86) PCT No.: PCT/SG2019/050064
§ 371 (c)(1),
(2) Date: Jul. 29, 2021

(87) PCT Pub. No.: WO2020/159434
PCT Pub. Date: Aug. 6, 2020

(65) Prior Publication Data
US 2022/0107174 A1    Apr. 7, 2022

(51) Int. Cl.
G06T 15/00    (2011.01)
G01B 11/25    (2006.01)

(52) U.S. Cl.
CPC ...... *G01B 11/2504* (2013.01); *G01B 11/2518* (2013.01); *G06T 15/005* (2013.01)

(58) Field of Classification Search
None
See application file for complete search history.

(56) References Cited

U.S. PATENT DOCUMENTS 5,039,868 A * 8/1991 Kobayashi ....... G01N 21/95684
                                                          348/42
5,406,372 A    4/1995 Vodanovic
(Continued)

FOREIGN PATENT DOCUMENTS

CN    202770413 U    3/2013
CN    106500627 A    3/2017
(Continued)

OTHER PUBLICATIONS

International Preliminary Report on Patentability for corresponding application PCT/SG2019/050064 filed Feb. 1, 2019, Report dated Sep. 27, 2019.
(Continued)

*Primary Examiner* — Tsung Yin Tsai
(74) *Attorney, Agent, or Firm* — CANTOR COLBURN LLP (57) ABSTRACT

The invention includes a system and method for obtaining high-resolution 3D images of objects. The system includes three cameras and three light sources that have different wavelengths (e.g. a red light source, a blue light source and a green light source). Each camera simultaneously captures a color image of the object. A processor separates each of the red light images, the blue light images and the green light images into separate monochrome images using each of the red light source, blue light source and green light source. The quality of the images are not subject to limited resolution of conventional RBG images. Because three different wavelengths of light are used, the surface can be accurately imaged, regardless of its characteristics (e.g. reflectivity and transparency). The system is well suited for industrial uses that require a high volume of objects, particularly those of mixed material, to be rapidly inspected for defects as small as a few microns.

18 Claims, 10 Drawing Sheets

(56) References Cited

U.S. PATENT DOCUMENTS

| | | | |
|---|---|---|---|
| 6,750,974 B2 | 6/2004 | Svetkoff | |
| 11,372,409 B2* | 6/2022 | Freitas | B62D 55/04 |
| 2012/0287247 A1 | 11/2012 | Stenger | |
| 2014/0029018 A1* | 1/2014 | Freitag | G01B 11/24 |
| | | | 356/601 |
| 2016/0078610 A1 | 3/2016 | Rudd | |
| 2019/0377346 A1* | 12/2019 | Freitas | B62D 55/06 |
| 2020/0284883 A1* | 9/2020 | Ferreira | G01S 7/4816 |

FOREIGN PATENT DOCUMENTS

| | | |
|---|---|---|
| JP | 2006258465 A | 9/2006 |
| WO | 2018072433 A1 | 4/2018 |

OTHER PUBLICATIONS

International Search Report for corresponding application PCT/SG2019/050064 filed Feb. 1, 2019, Report dated May 10, 2019.
Written Opinion for corresponding application PCT/SG2019/050064 filed Feb. 1, 2019, Report dated May 10, 2019.

* cited by examiner

FIG. 1A

| Subject Characteristic | Laser Parameters | Laser Power |
|---|---|---|
| High Reflectivity | Specular Reflection | Low |
| Low Reflectivity | Diffuse | High |
| Rough Surface | Diffuse | High |
| Smooth | Specular | Low |
| Glossy Material | Specular | Low |
| Matter Material | Specular | Low |
| Color | Wavelength | Varies |

SYSTEM AND METHOD OF OBJECT INSPECTION USING MULTISPECTRAL 3D LASER SCANNING

TECHNICAL FIELD

The invention relates to a system and method of three-dimensional (3D) imaging, and more specifically, to a system and method of producing high-resolution images across a wide field of view using multiple lasers for inspecting small objects such as electronic components.

BACKGROUND

Various applications require high-resolution imaging across a wide field of view (FOV). In high-precision manufacturing, objects are inspected to ensure the absence of flaws or irregularities. 3D vision can be essential as the inspection involves examining small but critical features on each component in different planes. For example, Automated Optical Inspection (AOI) systems are often used to analyze and evaluate electrical circuits, including flat panel displays, integrated circuits, chip carriers and printed circuit boards.

In AOI systems, a sensor such as a camera scans an object to confirm the presence of components and/or the absence of quality defects. It is a non-contact test method and is often used in multiple stages of a manufacturing process. Modern AOI systems often use three-dimensional (3D) laser scanning.

3D laser scanning is a non-contact, non-destructive technology that digitally captures the shape of physical objects using a line of laser light. 3D laser scanners create "point clouds" of data from the surface of an object. A digital representation of the size and shape of a physical object can be captured and saved in a computer.

Conventional AOI machines use two-dimensional (2D) measurements to create a 3D image. Typically, two cameras are placed horizontally from one another to obtain different views of an object. By comparing the two images, the relative depth information can be obtained in the form of a disparity map. However, this approach can be unsuited for some industrial uses because it can be slow and impractical for high volume processes. Other limitations include limited sensitivity and the detection of erroneous or false positive defects. Alternative methods have been developed in an effort toward improving 3D imaging technology.

Triangulation based 3D laser scanners shine a laser on a substrate and use a camera to look for the location of the laser dot. Depending on how far away the laser strikes a surface, the laser dot appears at different places in the camera's field of view. This technique is called triangulation because the laser dot, the camera and the laser emitter can form a triangle. The length of one side of the triangle, the distance between the camera and the laser emitter are known. The angle of the laser emitter corner is also known. The angle of the camera corner can be determined by the location of the laser dot in the camera's field of view. In most cases a laser strip, instead of a single laser dot, is swept across the object to speed up the process. While triangulation offers benefits to other techniques, alternative approaches often focus on overcoming its limitations.

For example, U.S. Pat. No. 5,406,372 describes a quad flat pack (QFP) chip package inspection system and method. Its purpose is to inspect leads on QFP chip packages. A package is scanned using two lasers and a sensor for detecting and processing reflected laser light from the object. Reflected light from each of the lasers provides data from each lead on the two transverse parallel edges.

Similarly, WO2018-072433 A1 describes a three-dimensional scanning method that uses multiple lasers. A 3D object is scanned using multiple lasers of differing wavelengths and multiple cameras for detecting and processing reflected laser emitted from an object. Laser contour lines projected onto a surface of a scanned object are photographed by two cameras. A spatial three-dimensional point cloud data can be constricted according to the trigonometry principle and the epipolar constraint principle.

U.S. Pat. No. 6,750,974 describes a method of scanning an object (e.g. a wafer) using a laser and camera for triangulation based sensor detection. The system aims to detect both specular and diffuse reflections of the object. As with other systems, a detector collects data from an illuminated surface. A second detector collects data from a second location that is fused with data from the first detector. However, as with other approaches, this system has shortcomings.

Conventional methods of laser scanning can be ineffective with substrates that are irregularly shaped or composed of more than one material. It can be difficult to identify portions of the substrate that are occluded or lie on an axis parallel to the source of laser light. Further, 3D laser scanning using a single laser on mix material may provide inadequate or poor scan data. The intensity and wavelength of laser light can be ineffective for particular substances. Using multiple scans with different laser parameters can mitigate some of the above issues but increases the time needed to complete the scanning. Sequential scans can also introduce errors due to mechanical offsets between scans. An improved system and method should overcome these issues. It should have a fast inspection speed including quick catches, high accuracy of inspection accuracy and high consistency of inspection.

A need, therefore, exists for a system and method to overcome the shortcomings of conventional 3D imaging systems. Specifically, there is a need for an improved system and method for obtaining 3D images of the surfaces of objects. The system should be capable of detecting flaws or irregularities on substrates that are composed of different materials. It should also be capable of operating at a high speed so that many objects can be inspected or screened in a short period of time.

SUMMARY OF THE INVENTION

The following summary is provided to facilitate an understanding of some of the innovative features unique to the disclosed embodiment and is not intended to be a full description. A full appreciation of the various aspects of the embodiments disclosed herein can be gained by taking into consideration the entire specification, claims, drawings, and abstract as a whole.

Embodiments of the invention include a system for obtaining a high-resolution 3D image of an object. The system can include (a) a first camera at a first location, (b) a second camera at a second location, (c) a third camera at a third location, (d) a red laser light source, (e) a blue laser light source, (f) a green laser light source and (g) a processing unit. The first camera can capture a first color image of the object and the processor can separate the first color image into a first monochrome image using the red laser light source, a second monochrome image using the blue laser light source and a third monochrome image using the green laser light source. The second camera can capture a second color image of the object and the processor can separate the second color image into a fourth monochrome image using the red laser light source, a fifth monochrome image using the blue laser light source and a sixth monochrome image using the green laser light source. Similarly, the third camera can capture a third color image of the object and the processor can separate the third color image into a seventh monochrome image using the red laser light source, an eighth monochrome image using the blue laser source and a ninth monochrome image using the green laser light source. The processing unit can combine the first monochrome image, the second monochrome image, the third monochrome image, the fourth monochrome image, the fifth monochrome image, the sixth monochrome image, the seventh monochrome image, the eighth monochrome image and the ninth monochrome image into a single high-resolution 3D image of the object.

The red laser light source, the blue laser light source and the green laser light source can be aligned at different points respective to each other on a y-axis and/or a z-axis. The first camera, the second camera and the third camera can be aligned at different points respective to each other on a y-axis and/or a z-axis. The processor can generate a first depth map, a second depth map, a third depth map, a fourth depth map, a fifth depth map, a sixth depth map, a seventh depth map, an eighth depth map and a ninth depth map based on point cloud data The processor can also generate a map of nine rows in nine depth using the first monochrome image, the second monochrome image, the third monochrome image, the fourth monochrome image, the fifth monochrome image, the sixth monochrome image, the monochrome seventh image, the eighth monochrome image and the ninth monochrome image by triangulation.

Embodiments also include a method of obtaining a high-resolution 3D image of an object, comprising steps of (a) moving the object toward the intersection of a laser fan plane (b) illuminating the object with a red laser light source, (c) illuminating the object with a blue laser light source, (d) illuminating the object with a green laser light source, (e) capturing a first color image of the object with a first camera, (f) simultaneously capturing a second color image of the object with a second camera, (g) simultaneously capturing a third color image of the object with a third camera, (h) separating the first color image into a first monochrome image using the red laser light source, a second monochrome image using the blue laser light source and a third monochrome image using the green laser light source, (i) separating the second color image into a fourth monochrome image using the red laser light source, a fifth monochrome image using the blue laser light source and a sixth monochrome image using the green laser light source, (j) separating the third color image into a seventh monochrome image using the red laser light source, an eighth monochrome image using the blue laser source and a ninth monochrome image using the green laser light source, (k) converting the first monochrome image, the second monochrome image, the third monochrome image, the fourth monochrome image, the fifth monochrome image, the sixth monochrome image, the seventh monochrome image, the eighth monochrome image and the ninth monochrome image into point-cloud data; and (l) creating a single high-resolution 3D image from the point-cloud data.

The method can include a step of moving the object to capture additional color images to generate additional point cloud data. It can also include a step of identifying and/or filtering erroneous data points as outlying point cloud data and a step of creating and analysing a depth map image for defects on the object. Further, the method can include a step of adjusting the region of interest (ROI) the first camera, the second camera and/or the third camera to capture different surface heights on the object.

INTRODUCTION

A first aspect of the invention is a system for obtaining 3D images of an object for inspection and/or identification of surface defects that uses multiple laser light sources and triangulation to improve the accuracy of point cloud data.

A second aspect of the invention is a system that uses multiple lasers and detectors that are aligned apart from one another on two axis (e.g. x and z) to scan the surface of an object.

A third aspect of the invention is a method of separating a color image into monochrome images and creating a single high-resolution image from point cloud data.

A fourth aspect of the invention is a system for obtaining a 3D image of an object of mixed material wherein a single scanned image is captured using light sources of different wavelengths.

A fifth aspect of the invention is a system for inspecting an object of mixed material using light sources of different wavelengths and multiple sensors/detectors.

A sixth aspect of the invention is a method of inspecting an object of mixed material using light sources that are aligned apart from one another on two axis (e.g. x and z).

A seventh aspect of the invention is a method of calibrating a system with multiple laser light sources using a jig or block of known dimensions.

DEFINITIONS

The term "albedo" refers to a measure of the diffuse reflection of solar radiation out of the total solar radiation received by an astronomical body. It is dimensionless and measured on a scale from 0 to 1. Surface albedo refers to the ratio of irradiance reflected to the irradiance received by a surface.

The term "bayer filter" refers to a color filter array (CFA) for arranging RGB color filters on a square grid of photosensors. Its particular arrangement of color filters is common in single-chip digital image sensors used in digital cameras, camcorders, and scanners to create a color image. The filter pattern is 50% green, 25% red and 25% blue, hence is also referred to as BGGR, RGBG, GRGB or RGGB.

The term "bilateral filter" refers to a non-linear, edge-preserving, and noise-reducing smoothing filter for images. It replaces the intensity of each pixel with a weighted average of intensity values from nearby pixels. This weight can be based on a Gaussian distribution. Crucially, the weights depend not only on Euclidean distance of pixels, but also on the radiometric differences (e.g., range differences, such as color intensity, depth distance, etc.). This preserves sharp edges.

The term "centroid" or "geometric center of a plane figure" refers to the arithmetic mean position of all the points in the figure. Informally, it is the point at which a cutout of the shape could be perfectly balanced on the tip of a pin.

The term "depth map" refers to an image or image channel that contains information relating to the distance of the surfaces of scene objects from a viewpoint. In 3D computer graphics, a depth map is an image or image channel that contains information relating to the distance of the surfaces of scene objects from a viewpoint. The term is related to and may be analogous to depth buffer, Z-buffer, Z-buffering and Z-depth.

The term "diffuse reflection" refers to the reflection of light or other waves or particles from a surface such that a ray incident on the surface is scattered at many angles rather than at just one angle as in the case of specular reflection. An ideal diffuse reflecting surface is said to exhibit Lambertian reflection, meaning that there is equal luminance when viewed from all directions lying in the half-space adjacent to the surface.

The term "epipolar geometry" refers to the geometry of stereo vision. When two cameras view a 3D scene from two distinct positions, there are a number of geometric relations between the 3D points and their projections onto the 2D images that lead to constraints between the image points.

The term "integrated circuit," "IC" or "wafer" refers to a small complex of electronic components and their connections that is produced in or on a small slice of material such as silicon.

The term "laser fan plane" refers to a two-dimensional surface with indeterminate width and length, zero thickness and zero curvature casted by a line laser with a fan angle. Laser light will form a fan-shape that results from laser divergence. Laser beams diverge to a certain degree. The beam divergence (i.e. laser fan plane) defines how much the beam spreads out over increasing distance from the optical aperture.

The term "optical axis" refers to a line along which there is some degree of rotational symmetry in an optical system such as a camera lens or microscope. The optical axis is an imaginary line that defines the path along which light propagates through the system, up to first approximation.

The term "point cloud" refers to a large set of data points in space. Laser scanners can collect point cloud data from surface points on an object. The data can be used for quality inspection and/or visualization of the object.

The term "Quad Flat Package" or "QFP" refers to a surface mount integrated circuit package with "gull wing" leads extending from each of the four sides.

The term "semiconductor chip," as used herein, refers to an integrated circuit or monolithic integrated circuit (also referred to as an IC, a chip, or a microchip) which is a set of electronic circuits on one small plate ("chip") of semiconductor material, normally silicon.

The term "specular reflection" or "regular reflection" refers to the mirror-like reflection of waves from a surface. Each incident ray is reflected at the same angle to the surface normal as the incident ray, but on the opposing side of the surface normal in the plane formed by incident and reflected rays.

The term "Thin Small Outline Package" or "TSOP" refers to a type of surface mount Integrated Circuit (IC) package. They typically have leads on two sides and are often used for RAM or Flash memory ICs due to their high pin count and small volume.

The term "triangulation" refers to a process of determining a point in 3D space given its projections onto two or more images. Its location can be determined if the parameters of the camera projection function from 3D to 2D for the cameras are known. For example, an incident laser beam strikes an object. The instantaneous field of view of the sensor can thereafter be determined by a sensor and optical system. Height and gray scale information are provided from a signal processor to a computer for image processing and analysis.

The term "voxel" refers to a value on a regular grid in three-dimensional space. As with pixels in a bitmap, voxels themselves do not typically have their position (their coordinates) explicitly encoded along with their values. Instead, rendering systems infer the position of a voxel based upon its position relative to other voxels (i.e., its position in the data structure that makes up a single volumetric image). In contrast to pixels and voxels, points and polygons are often explicitly represented by the coordinates of their vertices.

BRIEF DESCRIPTION OF THE FIGURES

The drawings described herein are for illustrative purposes only of selected embodiments and not all possible implementations, and are not intended to limit the scope of the disclosure.

DETAILED DESCRIPTION OF THE INVENTION

An objective of the invention is to provide high-resolution images to inspect three-dimensional features on small objects with greater speed with higher sensitivity than conventional approaches. Further, by using different wavelengths of light, different kinds of materials can be visualized and inspected.

In conventional lens-based imaging systems, a large space-bandwidth product requires using higher magnification and larger lenses. The image sensors are also made larger with higher pixel counts. In the alternative, image sensors with a smaller pixel pitch can be used while maintaining a large active area. However, larger components can be expensive and make the system bulky and cumbersome. Moreover, such systems can be slow and impractical for industrial uses.

Another objective of the invention is to improve the accuracy of "point cloud" data generated of the contours and geometry of an object. The invention utilizes the premise of laser triangulation between a laser dot or line on the object, a camera and the laser emitted. However, the quality of the scanned data using this triangulation is affected by the intensity of the laser (density of the point cloud) and the properties of the object surface to be scanned. Because many objects are a mix of materials and properties with either a spectral reflection or diffuse reflection, the laser scanning parameters must be optimized in order to improve the quality and accuracy of the image.

A single light source can be used to generate a single image of an object. Different light sources can be used to take multiple images consecutively. The images can then be combined. An alternative approach can use different light sources that are combined with mirrors and/or lenses. However, these methods can be tedious and lack precision. Regardless of the approach, the quality of scanned data is dependent on the density of point cloud which can be affected by the wavelength and intensity of the laser as well as the surface of the object.

Figure 1A:
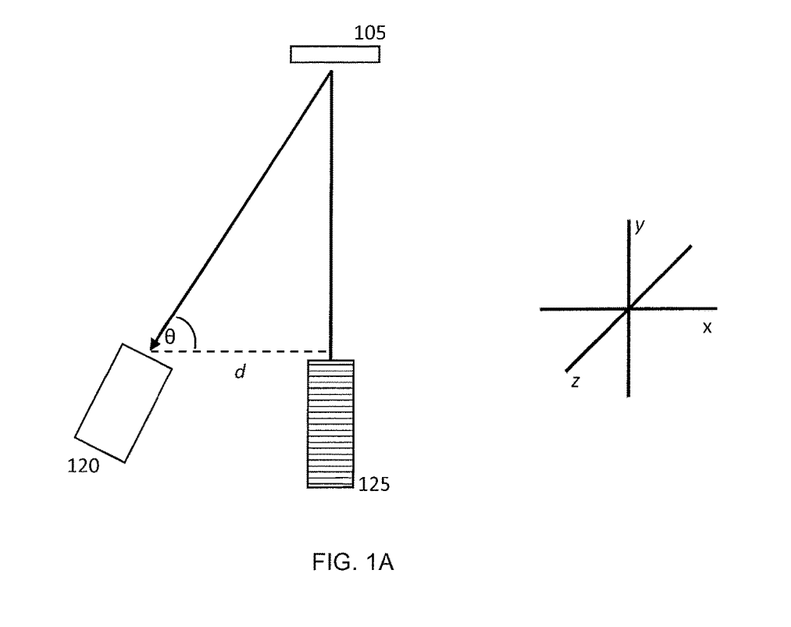
FIG. 1A depicts an arrangement of components of a system for obtaining 3D images of objects to inspect and/or detect small irregularities or flaws, according to one aspect of the invention.

FIG. 1A depicts a system for recording an image and/or inspecting an object such as an electronic component. The horizontal (x) axis, vertical (y) axis and z-axis are also depicted. An object 105 is placed in a field of view. A source of laser light 125 emits light onto the object. Reflected light is detected with a sensor 120 such as a camera. Depending on how far away the laser strikes a surface, the laser dot appears at different places in the camera's field of view. The angle of the laser emitter corner is known and the angle of the camera corner can be determined by looking at the location of the laser dot in the camera's field of view. The shape and size of the triangle can be determined along with the location of the laser dot corner of the triangle.

This process can be repeated to generate a series of data points (i.e. a point cloud). An additional light source and/or sensor can be added to the system to produce additional data points for the point cloud.

While effective for some applications, this approach has limitations including inadequate quality of scanned data. For example, sections of the object on the opposite side of the camera can be occluded. An image of these sections can be grainy and/or have poor resolution. The surface type can also affect the image. An object with high reflectivity may not lead to a clear image.

Quality of Scanned Data

A point cloud can be used to construct a 3D image. A sufficient amount of scanned data is needed for a point cloud of sufficient density. The quality of scanned data is affected by the intensity of the laser line that is projected onto an object. The intensity of the laser line also depends on the character of the surface of the object. The reflectivity, transparency, roughness, material and color can affect how the laser light is detected by the camera.

Point Cloud Filtering

Point sets obtained by imaging devices such as 3D scanners are often corrupted with noise. Noise can be caused by tangential acquisition direction, changing environmental lights and/or a reflective object material. In one embodiment, each capture laser line is processed into a row of point clouds. The points overlap with points generated from other lines.

Noise can be filtered by subsampling the points and converting the point cloud into a representation of a piecewise continuous surface. In a first method, using a single layer voxel grid, the z centroid of all points in each voxel is calculated. The x and y will be represented by the center of the voxel. In a second method, a single layer voxel grid is used. A bilateral filter is applied to z values. The x and y will be represented by the center of the voxel.

Surface Type

Given that reflectance is a directional property, most surfaces can be divided into those that give specular reflection and those that give diffuse reflection. Specular reflection, also known as regular reflection, is the mirror-like reflection of waves, such as light, from a surface. In this process, each incident ray is reflected at the same angle to the surface normal as the incident ray, but on the opposing side of the surface normal in the plane. For specular surfaces, such as glass or polished metal, reflectance will be nearly zero at all angles except at the appropriate reflected angle. Reflected radiation will follow a different path from incident radiation for all cases other than radiation normal to the surface.

Diffuse reflection is the reflection of light or other waves or particles from a surface such that a ray incident on the surface is scattered at many angles rather than at just one angle as in the case of specular reflection. An ideal diffuse reflecting surface is said to exhibit Lambertian reflection, meaning that there is equal luminance when viewed from all directions lying in the half-space adjacent to the surface. For diffuse surfaces, such as matte white paint, reflectance is uniform. Radiation is reflected in all angles equally or near-equally. Most real objects have some mixture of diffuse and specular reflective properties.

Optimization

Figure 1B:
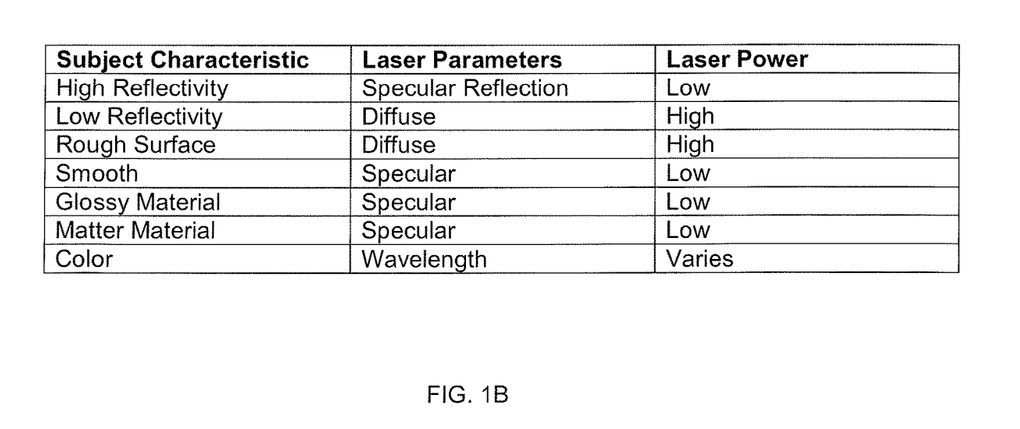
FIG. 1B is a table listing the preferred laser parameters and power for producing high-resolution images of substrates with various types of surfaces.

Depending on the surface characteristic of a substrate, the laser parameters can be adjusted to improve the quality of the image. For example a low power laser is better suited for use with substrate with high reflectivity. FIG. 1B depicts the preferred laser power and parameters for various surface types. However, a substrate can be composed of different materials, each with different characteristics. For example, a Quad Flat Package (QFP) typically has both plastic and metal surfaces. The plastic surface will exhibit diffuse reflection while the metal surface will exhibit specular reflection. Similarly, a Ball Grid Array (BGA) usually has both metal and plastic components.

3D Laser scanning using a single laser on a substrate of mixed material can lead to inadequate or poor quality data. Using multiple scans with different laser parameters can mitigate some of the above issues but increases the time needed to complete the scanning. Moreover, scanning at different times introduces errors due to mechanical offset between scans.

Figure 2A:
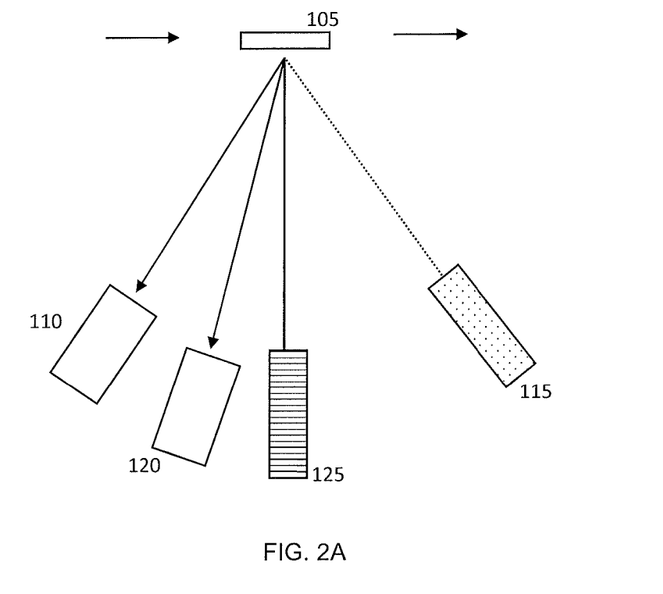
FIG. 2A depicts an arrangement of components of a multispectral system for obtaining high-resolution 3D images of small irregularities or flaws on an object, according to one aspect of the invention.

In the present invention, an object is scanned using multiple wavelengths of light simultaneously. FIG. 2A depicts a system for imaging small objects such as electronic components using multiple sources of laser light and sensors. An object 105 can move across a field of view. A first source of laser light 125 emits light onto the object. Simultaneously, a second source of laser light 115 emits light onto the object. Reflected light is detected with a first sensor 120

(e.g. camera) and a second sensor 110. The first and second sensor are preferably situated apart from one another on the z-plane.

Each sensor (110, 120) can detect light from the first source of laser light 125 and the second source of laser light 115. The source of laser light can be distinguished by its wavelength. Each sensor will capture two lines that are projected across the object. These lines can provide two sets of point clouds calculated which improves speed. Each location can scan two times from two lasers from different angles. However, specular reflection will occur from certain angles as well as occlusion.

Figure 2B:
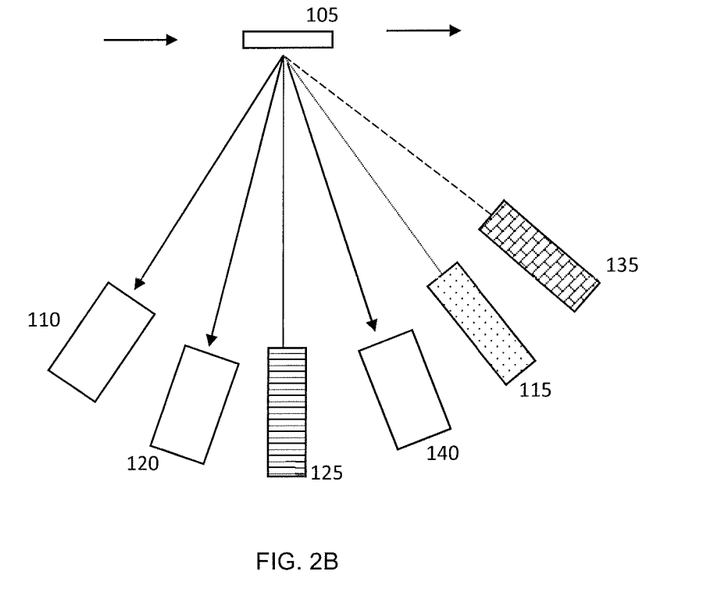
FIG. 2B depicts an arrangement of components of a multispectral system for obtaining high-resolution 3D images of objects to inspect and/or detect small irregularities or flaws, according to one aspect of the invention.

Similarly, FIG. 2B depicts a system for imaging small objects such as electronic components. An object 105 can move across a field of view. A first source of laser light 125 emits light onto the object. Simultaneously, a second source of laser light 115 emits light onto the object along with a third source of laser light 135. Each source uses a different wavelength of laser light. Reflected light is detected with a first sensor 120, a second sensor 110 and a third sensor 140. The first, second and third sensor are preferably situated apart from one another on the z-plane.

Figure 2C:
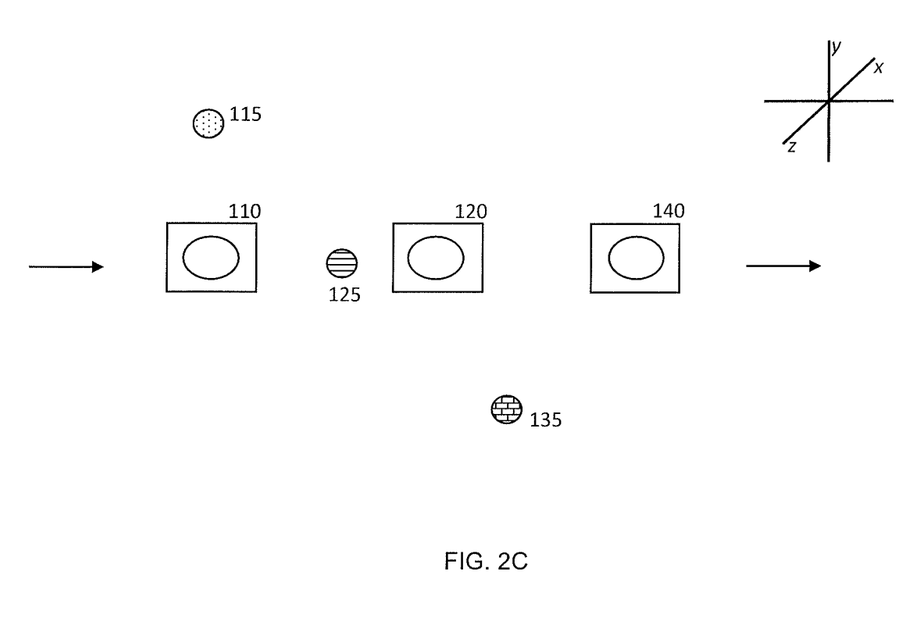
FIG. 2C depicts a bottom view of an arrangement of components of a multispectral system for obtaining high-resolution 3D images of objects for inspection and/or detection of small irregularities or flaws, according to one aspect of the invention.

FIG. 2C depicts the arrangement of the first, second and third sources of laser light from a different perspective. The laser lights are preferably situated apart from one another on the y-plane and the z-plane. With this arrangement, areas of the object 105 are not subject to occlusion.

Each camera will capture three lines that are projected across the object. These lines can provide three sets of point clouds which improves speed. Each location can scan three times from three lasers from different angles. Specular will occur from only a narrow angle, therefore only one out of three points may encounter specular reflection. With laser projecting from three angles, occlusion will be reduced. Further, any outlier points can be filtered using software.

Figure 3A:
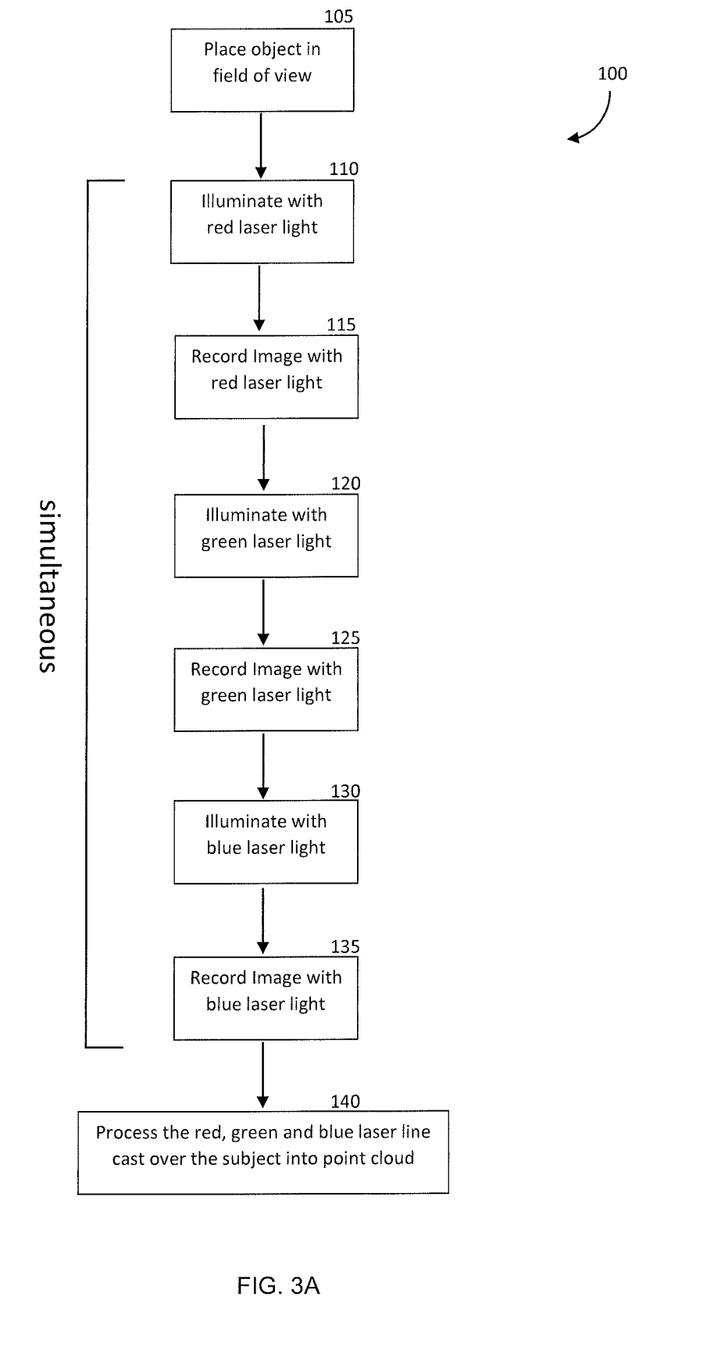
FIG. 3A is a flow chart that describes a process for obtaining high-resolution 3D images of an object using multiple cameras and multiple light sources, according to one aspect of the invention.

FIG. 3A is a flowchart 100 that lists the steps in a preferred method of creating a high-resolution 3D image of an object for inspection. First, the object is placed in the field of view of the cameras 105. A moving object can also be imaged, in which case, the other components are activated at when the substrate is within the field of view. The next series of steps occur simultaneously. The object is illuminated with a red laser light 110 and the image is recorded 115. The object is illuminated with a green laser light 120 and the image is recorded 125. The object is illuminated with a red laser light 130 and the image is recorded 135. The data is compiled from the three images.

Figure 3B:
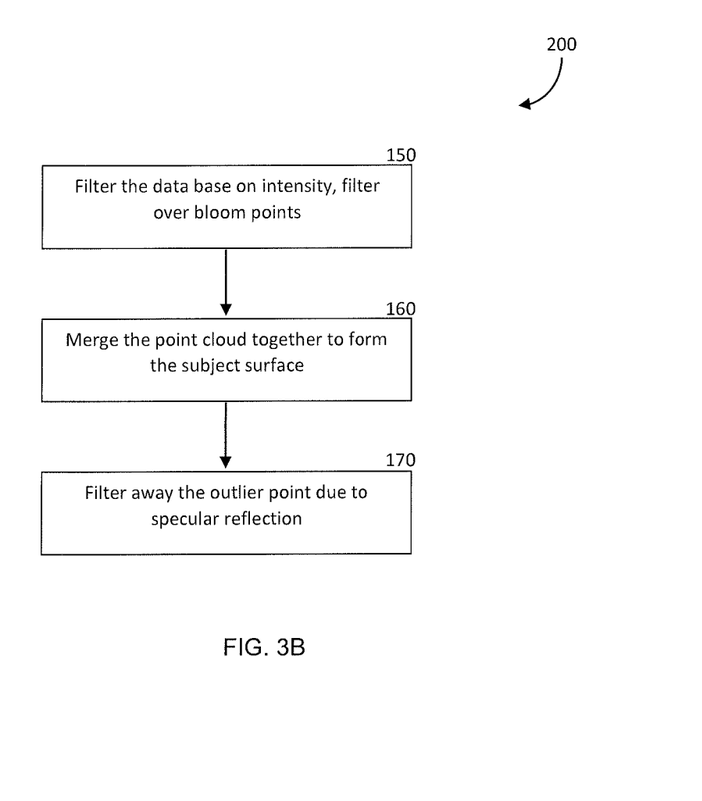
FIG. 3B is a flow chart that describes the steps in processing data to obtain a high-resolution 3D image, according to one aspect of the invention.

The red, green and blue laser line cast over the subject can be compiled into a point cloud 140. The point cloud is used to create an image of the substrate. FIG. 3B is a flowchart that lists the steps in utilizing the data 200. The data is filtered based on intensity over bloom points 150. Next, the point cloud data is merged together to form the surface of the subject 160. Any outlier points due to specular reflection can be filtered 170.

The effective camera sensor width and height, also known as the region of interest (ROI), can be reduced to improve the image data read out speed. Under normal setup, the ROI of all cameras capture the same region of a target surface. This is preferred when the object is flat or has slight differences in height. With an object that has a surface with substantial height variations, a different camera ROI can be used by each camera to capture the different surface heights. The data can be merged to form a final 3D map without a reduction in scanning speed and/or accuracy. Additionally, the two cameras can have an overlapping ROI on the surface and merge data together with an object that has a warped surface.

When the surface material has a substantial variation in reflectiveness or albedo, the light intensity of the different lasers can be varied. One can be set to a high power and one to a low power. The low powered laser line will record the high reflective surface and the high power laser will record the low reflective region. The data can be merged onto a 3D map to increase the dynamic range of the surface reflectivity and determine the albedo.

Dual Laser/Camera Approach

Figure 4A:
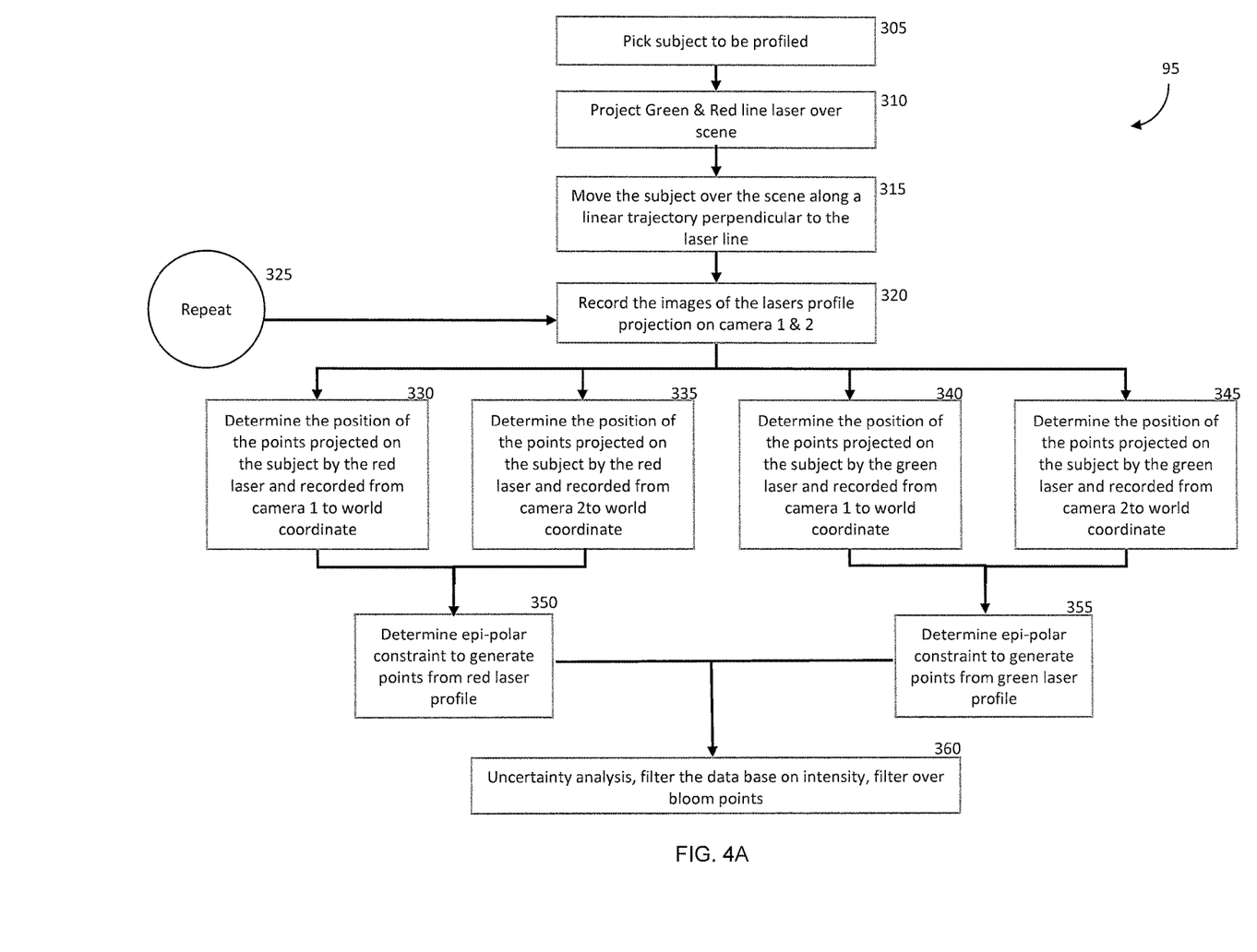
FIG. 4A is a flow chart that describes a process for obtaining high-resolution 3D images of objects using two cameras and two light sources, according to one aspect of the invention.

FIG. 4A is flowchart 95 that lists the steps in creating a high-resolution 3D image in detail. The process begins when an object (i.e. subject) is picked and placed in a field of view (FOV) 305. In this example, two laser light sources are used. Green laser light and red laser light are projected onto the object 310. The object can be moved along a linear trajectory perpendicular to the laser line 315. Next, images of the object are recorded simultaneously with two cameras 320. The imaging step can be repeated 325 to gather additional image data.

The next steps involve processing the images recorded from the two cameras. The following steps (330, 335, 340 and 345) involve collecting data for a point cloud. Each involves determining the position of points projected from laser light (red or green) and recorded by the first or second camera. Thereafter, the epipolar constraint is determined to generate points from the red laser profile 350 and the green laser profile 355. In the next step, an uncertainty analysis can be performed to filter the data base on intensity and/or filter over bloom points 360.

Figure 4B:
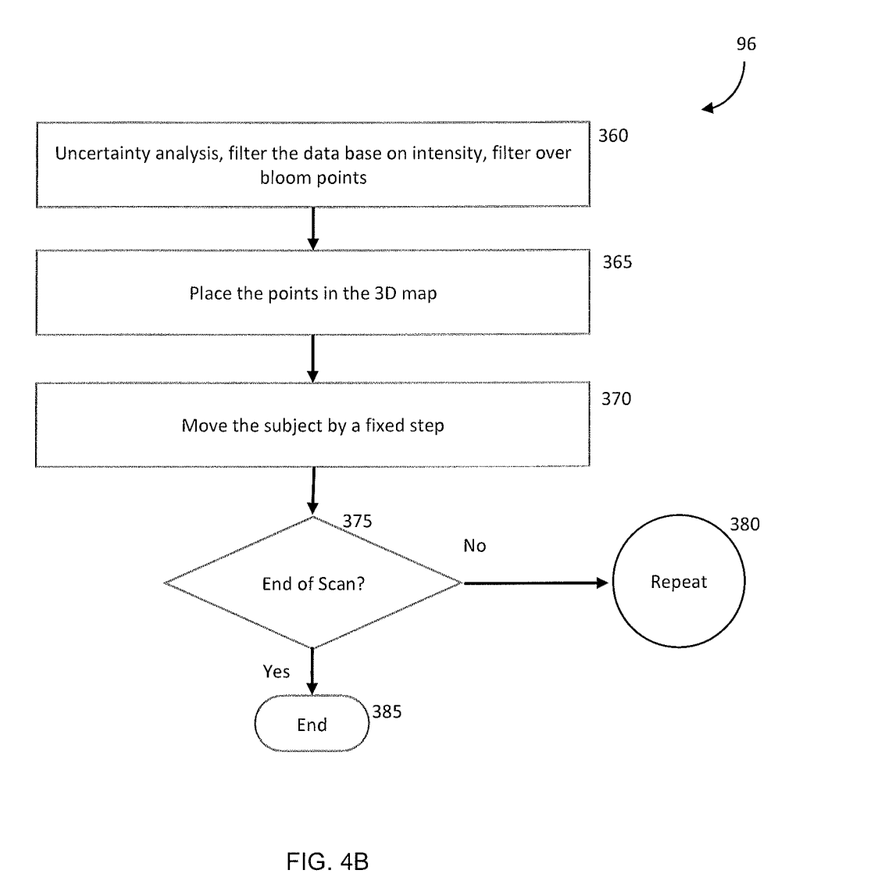
FIG. 4B is a flow chart that describes the steps in processing data to obtain high-resolution 3D images, according to one aspect of the invention.
Figure 5A:
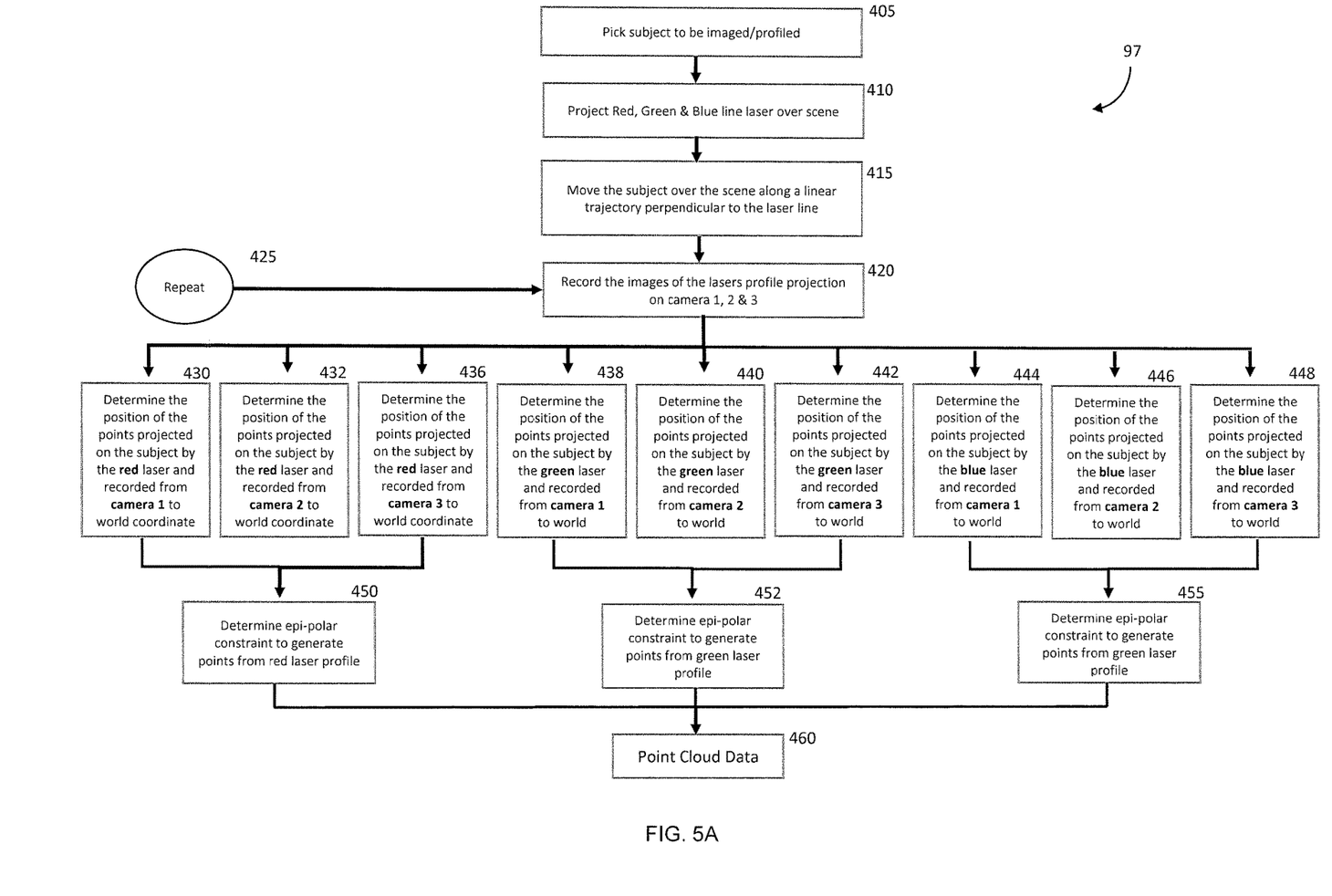
FIG. 5A is a flow chart that describes the steps in a process for obtaining high-resolution 3D images of an object using three cameras and three light sources, according to one aspect of the invention.
Figure 5B:
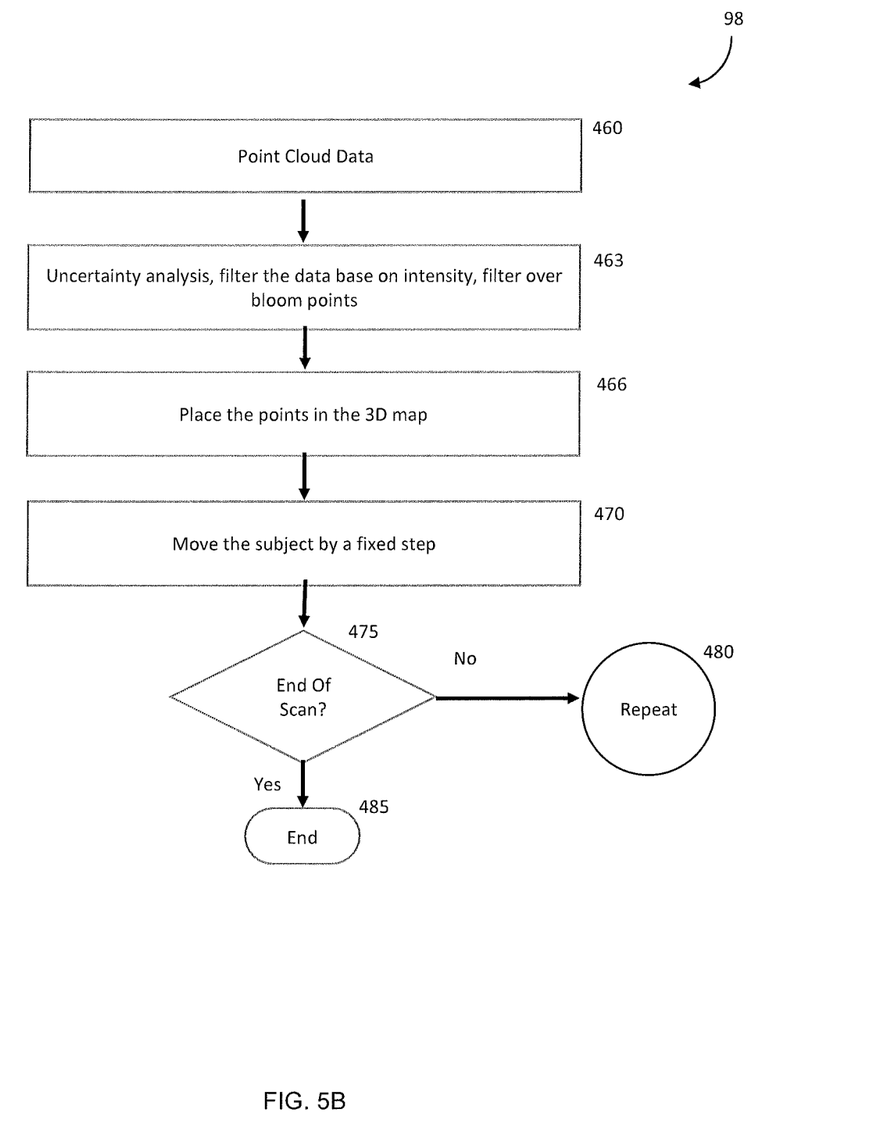
FIG. 5B is a flow chart that describes the steps of processing data to obtain high-resolution 3D images, according to one aspect of the invention.

FIG. 4B is a flowchart 96 that describes some of the steps in data analysis. After uncertainty analysis 360, data points can be placed on a three-dimensional (3D) map 365. The subject can be moved by a fixed step 370. The process can end 375 upon creation of the 3D map (375, 380). Alternatively, the process can be repeated 380 as additional images/data are collected.

System Calibration

Calibration is important to ensure the precision and reliability of the system. As object inspection often entails detecting minor deformations, the system must be calibrated to a high degree. Calibration of the x, y and z axis is necessary.

Figure 6A:
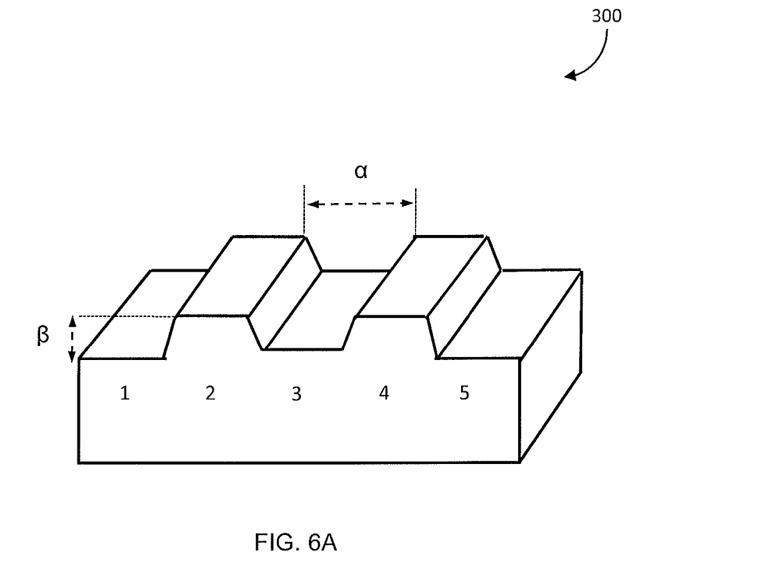
FIG. 6A is a perspective view of a calibration block, according to one aspect of the invention.
Figure 6B:
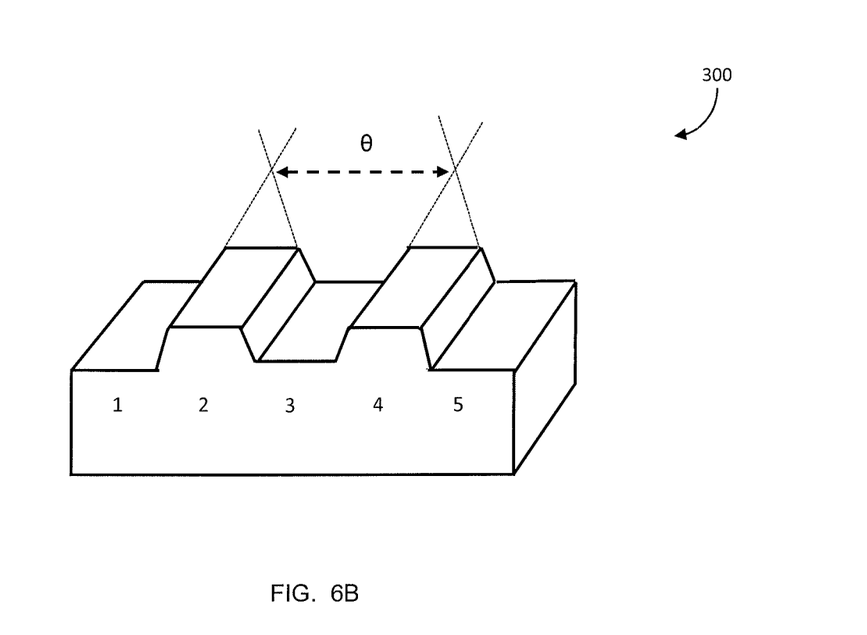
FIG. 6B is also a perspective view of a calibration block, according to one aspect of the invention.

The system can be calibrated using a calibration block of known dimensions. FIGS. 6A and 6B depict a perspective view of a block. The block is preferably square or rectangular in shape with symmetrical features to assist in calibration. The top portion can include two protruded portions, the precise dimensions of which are known. Further, the distance between the protruded portions is known along with the angles of each side portion.

FIG. 6A depicts a calibration block 300. The block can be described based on five regions as labelled (1-5). The step (i.e. protruded) portions are represented by regions 2 and 4. As the distance between these regions is known (a), it can be used to calibrate one or more lasers of the system. Similarly, the height of each of stepped region ($\beta$) can also be used to calibrate one or more lasers of the system.

Similarly, FIG. 6B depicts a calibration block 300. The plane of each side of the steps can be extrapolated to a point of intersection. This point can be determined for step 2 and step 4. The distance between the points (8) can also be used to calibrate one or more lasers of the system. Each laser can be calibrated independently using the block.

Working Example
3D Imaging and Inspection of a Ball Grid Array

A Ball Grid Array (BGA) usually has both metal and plastic components. Multispectral 3D laser scanning system that scans multiple wave-lengths can be used for such substrates. In this example, the first source of laser light and the second source of laser light emit different wavelengths of light. One laser is configures so that its wavelength is optimized for a reflective surface. Another laser is configures so that its wave length is optimized for diffuse reflection. Either a dual or single camera is used to scan with both lasers simultaneously emitting light.

For example, the first and second sources of laser light can be 450 nm and 650 nm respectively. This allows an object to be inspected simultaneously using multiple wavelengths of light. One wavelength of light can be optimal for reflective surface. The other wavelength of light can be optimal for diffuse reflection. Conventional approaches typically involve conducting multiple scans of an object which has limitations. The use of two lasers can also overcomes a shadow that can be present when a single light source is used.

A multispectral 3D laser scanning setup can use dual wave-length light sources (e.g. red and green). One wavelength is optimized for reflective surfaces. The other wavelength is optimized for diffuse reflection. Either single or dual cameras scan in the presence of both light sources. A third laser light source can be added to the system.

The system allows a scan of a substrate with multiple wavelengths at the same instance (rather than multiple scans). This leads to greater sensitivity without the need to combine data from different time points. The system is well suited to variations of reflectivity on the surface of a substrate. It also allows spectral scanning as different materials can react differently to different wavelengths of light.

The high-resolution image can be created by picking and placing an object (e.g. electrical component) in a FOV, toward the intersection of a laser fan plane. Next, the FOV is illuminated with a red laser light source, a blue laser light source and a green laser light source. In this example, three image capturing devices (i.e. color cameras) are used to simultaneously capture a first color image, a second color image and a third color image of the object.

Next, each color image is separated into three monochrome images. The monochrome images each utilize one wavelength (i.e. color) of laser light (red, blue and green). Accordingly, nine images in total are created at this step. Analysis of the images entails converting the monochrome images into a row of point-cloud data. Erroneous data points can be identified as outlying points and deleted. A first, second, third, fourth, fifth, sixth, seventh, eighth and a ninth depth map can be created using the point cloud data. Thereafter, a single high-resolution image can be created from the point-cloud data. The high-resolution image can be analyzed to identify imperfections and/or defects on the object.

The system can include a computer that contains software loaded thereon or executable by the computer to process raw images that are output from the sensor output of the image sensor. Images can be transferred to the computer using a conventional cable or wirelessly transmitted to the computer. The software can include the reconstruction algorithm described herein which may be embodied in MATLAB® or other program (e.g., C language). The software is executed by one or more processors contained in the computer. To improve performance, the computer can include a processor that is part of a graphics processing unit (GPU) to speed the image reconstruction process. The computer can include a personal computer, server, laptop or the like. The computer can also be coupled to or otherwise contain a monitor and one or more peripheral devices (e.g., mouse, keyboard, or the like). Reconstructed images can be displayed to the user on the monitor.

What is claimed is:

1. A system for obtaining a high-resolution 3D image of an object, comprising:
   a) a first camera at a first location;
   b) a second camera at a second location;
   c) a third camera at a third location;
   d) a red laser light source;
   e) a blue laser light source;
   f) a green laser light source; and
   g) a processing unit,
   wherein the first camera captures a first color image of the object and the processing unit separates the first color image into a first monochrome image using the red laser light source, a second monochrome image using the blue laser light source and a third monochrome image using the green laser light source,
   wherein the second camera captures a second color image of the object and the processing unit separates the second color image into a fourth monochrome image using the red laser light source, a fifth monochrome image using the blue laser light source and a sixth monochrome image using the green laser light source,
   wherein the third camera captures a third color image of the object and the processing unit separates the third color image into a seventh monochrome image using the red laser light source, an eighth monochrome image using the blue laser source and a ninth monochrome image using the green laser light source, wherein each camera captures three lines that are projected across the object and the three lines provide three sets of point clouds, wherein each position is scanned three times from three lasers from different angles,
   wherein the processing unit converts the first monochrome image, the second monochrome image, the third monochrome image, the fourth monochrome image, the fifth monochrome image, the sixth monochrome image, the seventh monochrome image, the eighth monochrome image and the ninth monochrome image into point cloud data; and
   wherein the processing unit creates a single high-resolution 3D image of the object from the point cloud data.

2. The system of claim 1, wherein the red laser light source, the blue laser light source and the green laser light source are aligned at different points respective to each other on a y-axis and a z-axis.

3. The system of claim 1, wherein the processing unit generates a map of nine rows in nine depth using the first monochrome image, the second monochrome image, the third monochrome image, the fourth monochrome image, the fifth monochrome image, the sixth monochrome image, the monochrome seventh image, the eighth monochrome image and the ninth monochrome image by triangulation.

4. The system of claim 1, wherein the processing unit generates a first depth map, a second depth map, a third depth map, a fourth depth map, a fifth depth map, a sixth depth map, a seventh depth map, an eighth depth map and a ninth depth map based on point cloud data.

5. The system of claim 4, wherein the first depth map, the fourth depth map and the seventh depth map are aligned with one another on the x-axis;

wherein the second depth map, the fifth depth map and eighth depth map are aligned with one another on the x-axis; and wherein the third depth map, the sixth depth map and the ninth depth map are aligned with one another on the x-axis.

6. The system of claim 1, wherein the first camera, the second camera and the third camera are aligned at different points respective to each other on a y-axis and a z-axis.

7. The system of claim 1, wherein the surface of the object is comprised of more than one material, each material having different light reflection characteristics.

8. The system of claim 1, wherein the object is a wafer or an integrated circuit (IC) package.

9. The system of claim 1, wherein a calibration jig with known dimensions is used to position and/or calibrate the location of the red laser light source, the green laser light source and the blue laser light source.

10. A method of obtaining a high-resolution 3D image of an object, comprising steps of:
   a) moving the object toward the intersection of a laser fan plane;
   b) illuminating the object with a red laser light source;
   c) illuminating the object with a blue laser light source;
   d) illuminating the object with a green laser light source;
   e) capturing a first color image of the object with a first camera;
   f) simultaneously capturing a second color image of the object with a second camera;
   g) simultaneously capturing a third color image of the object with a third camera, wherein each camera captures three lines that are projected across the object and the three lines provide three sets of point clouds, wherein each position is scanned three times from three lasers from different angles;
   h) separating the first color image into a first monochrome image using the red laser light source, a second monochrome image using the blue laser light source and a third monochrome image using the green laser light source;
   i) separating the second color image into a fourth monochrome image using the red laser light source, a fifth monochrome image using the blue laser light source and a sixth monochrome image using the green laser light source,
   j) separating the third color image into a seventh monochrome image using the red laser light source, an eighth monochrome image using the blue laser source and a ninth monochrome image using the green laser light source;
   k) converting the first monochrome image, the second monochrome image, the third monochrome image, the fourth monochrome image, the fifth monochrome image, the sixth monochrome image, the seventh monochrome image, the eighth monochrome image and the ninth monochrome image into point-cloud data; and
   l) Creating a single high-resolution 3D image from the point-cloud data.

11. The method of claim 10, including a step of moving the object to capture additional color images and generate additional point cloud data.

12. The method of claim 10, including a step of identifying and/or filtering erroneous data points as outlying point cloud data.

13. The method of claim 10, including a step of creating and analysing a depth map image for defects on the object.

14. The method of claim 10, wherein the red laser, the blue laser and the green laser are aligned at different points respective to each other on a y-axis and a z-axis.

15. The method of claim 10, wherein the surface of the object is comprised of more than one material, each material having different light reflection characteristics.

16. The method of claim 10 including a step of identifying defects, irregularities and/or surface flaws on the object.

17. The method of claim 10, including a step of adjusting the region of interest (ROI) of at least one of the first camera, the second camera and the third camera to capture different surface heights on the object.

18. The method of claim 10, including a step of calibrating the red laser, the blue laser and the green laser with a calibration jig.

* * * * *